United States Patent [19]
Kurtz et al.

[11] Patent Number: 5,597,738
[45] Date of Patent: Jan. 28, 1997

[54] METHOD FOR FORMING ISOLATED CMOS STRUCTURES ON SOI STRUCTURES

[75] Inventors: Anthony D. Kurtz, Teaneck, N.J.; Joseph S. Shor, Flushing, N.Y.; Alexander A. Ned, Bloomingdale, N.J.

[73] Assignee: Kulite Semiconductor Products, Inc., Leonia, N.J.

[21] Appl. No.: 400,139

[22] Filed: Mar. 6, 1995

Related U.S. Application Data

[63] Continuation of Ser. No. 162,715, Dec. 3, 1993, abandoned.

[51] Int. Cl.⁶ .................................................. H01L 21/265
[52] U.S. Cl. ........................ 437/21; 437/46; 437/47; 437/57; 437/69; 437/71; 437/62; 437/101; 437/187; 437/239; 148/DIG. 150; 148/DIG. 152
[58] Field of Search ........................ 437/21, 62, 71, 437/69, 239, 47, 46, 57, 904, 918, 919, 187, 101; 148/DIG. 150, DIG. 152

[56] References Cited

U.S. PATENT DOCUMENTS

| | | | |
|---|---|---|---|
| 4,104,090 | 8/1978 | Pogge | 148/175 |
| 4,143,177 | 3/1979 | Kovac et al. | 427/79 |
| 4,393,577 | 7/1983 | Imai | 29/576 W |
| 4,532,700 | 8/1985 | Kinney et al. | 29/576 W |
| 4,628,591 | 12/1986 | Zorinsky et al. | 29/576 W |
| 4,716,128 | 12/1987 | Schubert et al. | 437/41 |
| 4,910,165 | 3/1990 | Lee et al. | 437/90 |
| 5,023,200 | 6/1991 | Blewer et al. | 437/187 |
| 5,100,810 | 3/1992 | Yoshimi et al. | 437/21 |
| 5,298,767 | 3/1994 | Shor et al. | 257/77 |
| 5,466,631 | 11/1995 | Ichikawa et al. | 437/62 |

FOREIGN PATENT DOCUMENTS

| | | | |
|---|---|---|---|
| 0020678 | 2/1979 | Japan | 437/62 |
| 0242636 | 12/1985 | Japan | 437/62 |
| 0058852 | 3/1988 | Japan | 437/62 |
| 0187741 | 7/1989 | Japan | 437/62 |
| 0230755 | 9/1990 | Japan | 437/62 |
| 0006039 | 1/1991 | Japan | 437/62 |
| 0070155 | 3/1991 | Japan | 437/62 |
| 0070156 | 3/1991 | Japan | 437/62 |

OTHER PUBLICATIONS

"Very Thin Silicon–on–Insulator Devices for CMOS at 500° C.", by John B. McKitterick, pp. 37–41, Jul. 1993.

*Primary Examiner*—John Niebling
*Assistant Examiner*—Long Pham
*Attorney, Agent, or Firm*—Plevy & Associates

[57] ABSTRACT

A method for fabricating a single crystal silicon on insulator material by forming oxidized layers underneath epi islands without damaging the surface quality of the silicon. In an illustrative embodiment, an epitaxial layer of p-type silicon is grown on a substrate of n-type silicon. A plurality of islands are defined from the epitaxial layer. A semiconductor device is fabricated from one of the p-islands by electrochemically anodizing a region of the substrate beneath that p-island, which p-island can be used to fabricate a selected semiconductor device. If n-type material is required for device fabrication, a device layer of n-type silicon can be grown on the surface of a p-islands and that p-island can be anodized and oxidized to form the insulating layer between the device layer and substrate. In this manner, MOS transistors and other devices may be fabricated for operation at temperatures of up to 500° C.

12 Claims, 4 Drawing Sheets

METHOD FOR FORMING ISOLATED CMOS STRUCTURES ON SOI STRUCTURES

This is a continuation of application Ser. No. 08/162,715, filed on Dec. 3, 1993, entitled Isolated CMOS Structures and Related Methods now abandoned.

RELATED APPLICATIONS

The assignee herein, Kulite Semiconductors Products, is the record owner of U.S. patent application Ser. No. 08/115,893 filed Sep. 1, 1993, which is a continuation-in-part of application Ser. No. 07/957,519 filed Oct. 6, 1992 for J. S. Shor et al. and entitled "POROUS SILICON CARBIDE (SiC) RELATED METHODS AND APPARATUS", now U.S. Pat. No. 5,298,767.

BACKGROUND OF THE INVENTION

This invention relates to semiconductor devices in general and, more particularly, to a semiconductor isolation processes which may be utilized in the fabrication of CMOS structures.

It is known that CMOS transistors can be fabricated from bulk silicon with conventional techniques to produce devices with high mobilities, low reverse leakage currents, and no latch-up problems at temperatures of operation below 300° C. The aforementioned properties can not be maintained, however, at temperatures above 300° C. Essentially, the problems of latch-up and leakage currents to the well at higher temperatures make it difficult to distinguish between a high state (transistor on) and a low state (transistor off). Accordingly, SIMOX (Separation by Implanted Oxygen) and bond and etch back techniques have been developed to fabricate MOS structures able to operate effectively at higher temperatures. Reference is made, for example, to an article by John B. McKitterick entitled "Very Thin Silicon-On-Insulator Devices For CMOS at 500° C.", pp. 37–41. The primary disadvantages associated with such techniques, however, is that they introduce surface damage due to etching and implantation processes. This surface damage will in turn introduce Qox (oxide charge) during growth of the gate oxide. Qox is detrimental to the overall performance of a CMOS device because it causes drift.

Although various techniques can be utilized to improve the overall quality of the silicon surface, they tend to complicate processing and provide only limited improvement in device performance. As such, it is heretofore been extremely difficult, if not impossible, to fabricate a diverse structure such as a CMOS that can operate to 500° C. with its critical properties preserved.

Accordingly, it is a principal object of the present invention to provide a method of fabricating a CMOS device which will operate at temperatures of up to 500° C. while avoiding the aforementioned problems associated with the prior art.

SUMMARY OF THE INVENTION

The aforementioned objective, as well as others which will become apparent to those of ordinary skill in the art, is obtained by a process in which a porous silicon layer is formed and oxidized to produce a novel silicon-on-insulator (SOI)

A method for fabricating a single crystal silicon on insulator material by forming oxidized layers underneath epi islands without damaging the surface quality of the silicon. Oxidized porous silicon will comprise the underlying isolation layers by making the silicon under the region to be isolated porous, and then oxidizing the porous material. The single crystal islands isolated from the rest of the bulk silicon may now be processed utilizing conventional MOS procedures to form a high temperature MOS structure.

The process of the present invention may be employed to fabricate both p-type and n-type SOI structures without the need for bonding and etching steps. The fabrication of p-type SOI structures is made possible by an electrochemical anodization process in which n-type silicon is made porous while leaving p-type silicon inert, or vice-versa. Once the porous region has been formed, it is subjected to an oxidizing ambient at high temperature in which it is completely oxidized. The oxidized region is densified, whereupon subsequent conventional semiconductor processing techniques may be employed in a cost effective manner.

A major advantage of this invention is the ability to fabricate p and n-type islands on any desired thickness of an oxide. The thickness of the oxide may be easily controlled. This capability is not available with other techniques. For example, in SIMOX processes, the thickness of the underlying oxide is limited by the implantation depth. Another advantage is that the doping of the p- or n-type regions is very flexible since it does not have to meet any of the etchstop requirements associated with the other SOI processed.

DETAILED DESCRIPTION OF THE PREFERRED EMBODIMENT

Figure 1:
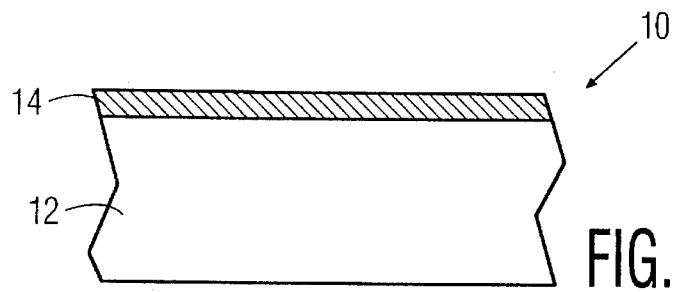
FIGS. 1–15 are sequential processing steps showing, by way of example, in cross-sectional side views of portions of an integrated circuit, the process of fabricating a high operating temperature MOS structure in accordance with the present invention.

Referring to FIG. 1, a portion of a silicon wafer suitable for use with the process of the present invention is illustrated in cross section. The dopant profile of the wafer illustrated in FIG. 1 may be accomplished by epitaxial deposition, by combined conventional dopant implantation and epitaxial deposition, by conventional gaseous dopant infusion, or by a combination of these techniques. While the wafer of FIG. 1 is depicted in an illustrative embodiment employing silicon, it will be appreciated that other semiconductor materials may also be employed. It will be further apparent to those of ordinary skill in the art that the basic wafer may be supplied as p-type or n-type with an opposite conductivity layer grown thereon.

As illustrated in FIG. 1, wafer 10 includes an underlying monocrystalline n-type silicon substrate 12 having an epitaxial layer of p-type silicon 14 formed on its upper surface. For convenience of illustration, the relative dimensions for the wafer illustrated in FIG. 1 are not drawn to scale. Typical depths for the regions of FIG. 1 are, for example, 400 μm for substrate 12 and approximately 2 μm for layer 14. The width of the wafer 10 will vary with the number of devices desired to be integrated thereon. For clarity, a portion of the wafer 10 corresponding only to formation of a single semiconductor device is illustrated.

Figure 2:
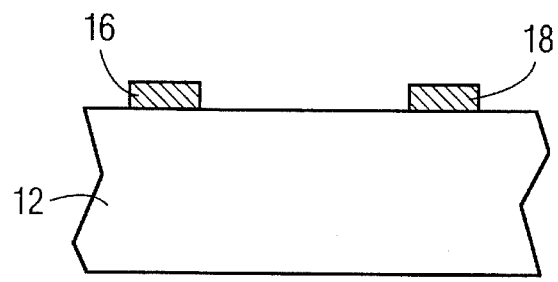

In FIG. 2, wafer 10 is illustrated after a processing step wherein quartz has been deposited over the p-type material, masked, and etched using well known etching/patterning techniques to define p-type islands. The p-type material that will not be utilized for semiconductor device fabrication is etched away using a conductivity selective etch to form islands 16 and 18, and the quartz is then removed from the surfaces of the islands to arrive at the structure depicted in FIG. 2. Thus, by etching, a first set of regions is created where the semiconductor devices on the substrate 12 are to be formed. The semiconductor devices may comprise diodes, transistors, or any other two-terminal or three terminal semiconductor devices or any combination thereof depending upon the specific design and requirements of the integrated circuit(s) or wafer(s) being manufactured.

Figure 3:
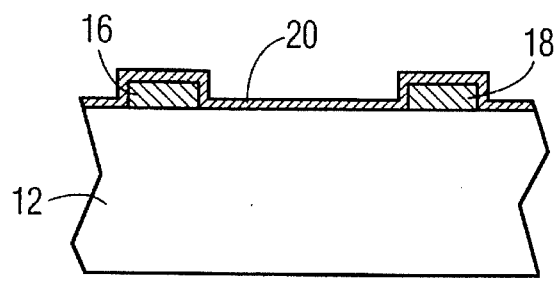
Figure 4:
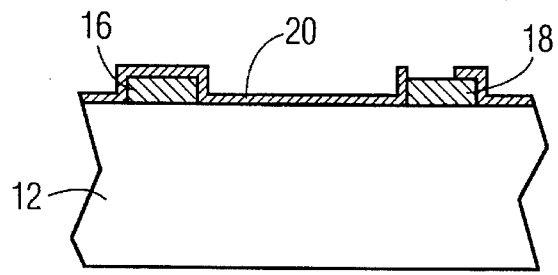

In FIG. 3, the wafer of the present example is shown after it has been thermally oxidized in a dry ambient to form a thin layer of silicon dioxide 20, which may have a thickness on the order of 1000 angstroms, over the upper surface. As shown in FIG. 4, silicon dioxide layer 20 is masked and etched to expose the surface of p-type island 18.

Figure 5:
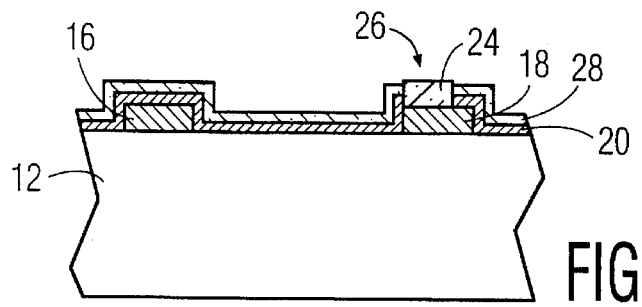

Referring to FIG. 5, wafer 10 is illustrated after an epitaxial layer of n-type silicon has been grown over the silicon dioxide layer 20. The growth of single crystal n-type silicon layer 24 is limited to the exposed surface of p-type island 18, thereby forming n/p island 26. The remainder of the epitaxial layer takes the form of a film of polysilicon 28 covering the surface of silicon dioxide layer 20. Using a suitable etchant, silicon dioxide layer 20 is etched in a conventional manner whereupon the polysilicon film 28 may be lifted off to leave only the p-island 16 and the n/p island 26 on the surface of substrate 12.

Figure 6:
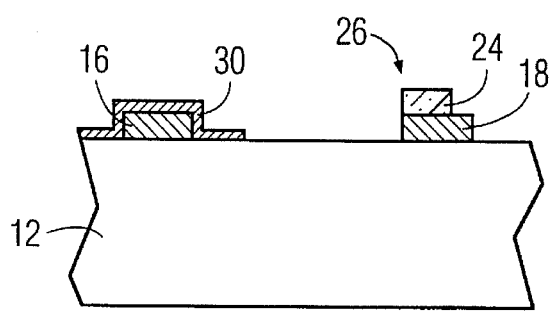

In FIG. 6, wafer 10 is shown after a layer of silicon nitride 30 has been deposited over the surface of wafer 10, masked with quartz, and etched to expose all surfaces of the wafer except those of p-type island 16. A layer of metal 32 is then deposited over the wafer, masked, and etched to expose all surfaces of the wafer except a portion of the n/p island 26, resulting in the structure depicted in FIG. 7. Metal layer 32 provides a low resistance electrical contact to facilitate an electrochemical anodization process in which the p-type portion 18 of island 27 is made porous. There is extensive literature in the prior art relating to the formation of porous semiconductors by such a process and reference may be had, for example, to an article by R. L. Smith and S. D. Collins appearing in the Journal of Applied Physics, Volume 8, R1 (1992) for a detailed description of porous silicon formation mechanisms. Reference may also be had to U.S. patent application Ser. No. 07/957,519, now U.S. Pat. 5,298,767, the disclosure of which is incorporated herein by reference, in which an electrochemical anodization process for forming porous layers in silicon carbide are described.

Figure 7:
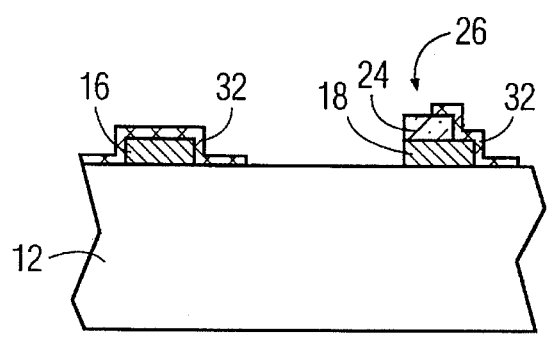

In accordance with an electrochemical anodization technique of the type disclosed in the aforementioned patent application, the substrate 10 is electrochemically anodized in the absence of UV light by placing the substrate 10 of FIG. 7, together with a copper strip for electrical connection, in an electrochemical cell (not shown) containing an electrolyte such as, for example, a dilute hydrofluoric acid solution. The cell has a platinum wire counter-electrode and a saturated calomel reference electrode. The substrate acts as the working electrode and is biased with respect to the saturated calomel electrode at a suitable potential for the p-type layer 18 to corrode. In the absence of UV light, the n-type silicon comprising substrate 12 and island 24 will remain inert. Moreover, silicon nitride layer 30 prevents the formation of pores in p-type island 16. It will be readily appreciated that in accordance with the aforementioned technique, each exposed island of p-type silicon disposed between an n-type island to be isolated and the surface of substrate 12 may be made porous.

Figure 8:
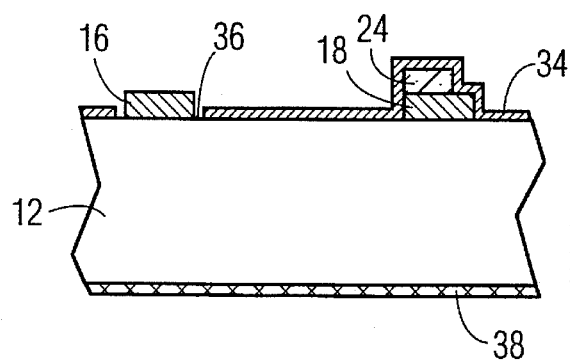

In like fashion, a portion of the n-type silicon substrate underlying each island of p-type silicon may also be made porous. FIG. 8 shows wafer 10 after the first anodization step, the removal of nitride layer 30 and metal layer 32, and after a second layer of silicon nitride 34 has been deposited over the surface of wafer 10, masked with quartz, and etched to expose only the surface of p-type island 16 and the surrounding surface 36 of substrate 12 immediately adjacent thereto. A layer of aluminum 38 is deposited on the back side of wafer 10 to provide a low resistance electrical contact. All surfaces of wafer 10 except upper surface 11, together with a copper strip for electrical connection to aluminum layer 38, is encapsulated in a suitable encapsulant such as black wax. The encapsulated wafer is again placed in the electrochemical cell wherein the wafer acts as the working electrode and is biased with respect to the saturated calomel electrode at a suitable potential for the n-type region underlying p-type island, but not the island itself, to photocorrode.

Figure 9:
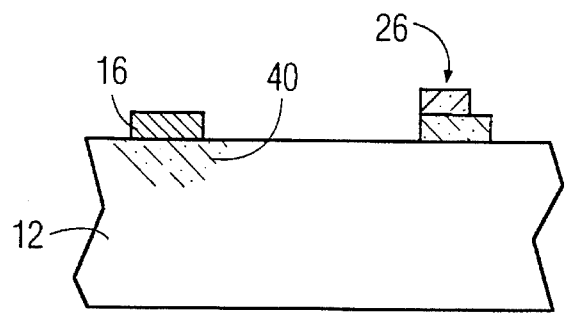

Ultraviolet (UV) light illuminates the exposed surface of p-type island 16 and the exposed surface of substrate 12 surrounding the same. As will be understood by reference to the aforementioned application, the depth of the porous n-type region 40 which thereby forms beneath p-type island 16 and its structure is determined by the anodization time, the UV light intensity, the applied potential, the pH, and the doping levels of the crystals. The resulting structure is depicted in FIG. 9 after the anodized wafer has been removed from the cell and the silicon nitride layer 36 and aluminum layer 38 have been removed.

Once p-type island 18 and n-type region 40 have been made porous, they must be oxidized without generating defects in the islands. Thermal oxidation is the preferred method of forming the oxidized porous silicon regions. The oxidation treatments are optimized to yield oxidized porous silicon with electrical and physical properties similar to those of thermal oxides. The use of high-pressure oxidation has been reported to eliminate formation of defects and reduce wafer warpage. The use of an initial low temperature (i.e. below 450° C.) treatment to stabilize the pores and thus avoid sintering has been reported to help fully oxidize porous silicon regions.

Figure 10:
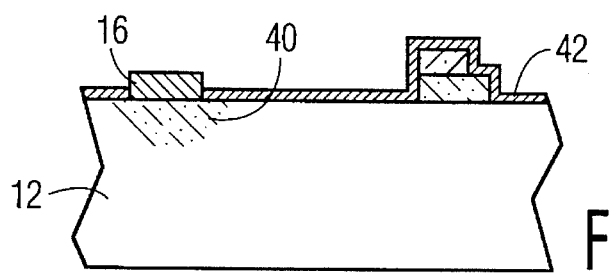

Referring to FIG. 10, wafer 10 is illustrated after the wafer has been subjected to a thermal oxidation in wet oxygen at a temperature between about 800° and 875° C. for a period of minutes. Since the thickness of the silicon walls between pores is thin, about 10 nm, actual oxidation of the porous regions is accomplished in very short times. During the oxidation process, a field oxide layer 42 grows over the surface of the wafer. Using a conventional photolithographic process, layer 42 is masked and etched to expose the upper surfaces of p-type island 16.

Figure 11:
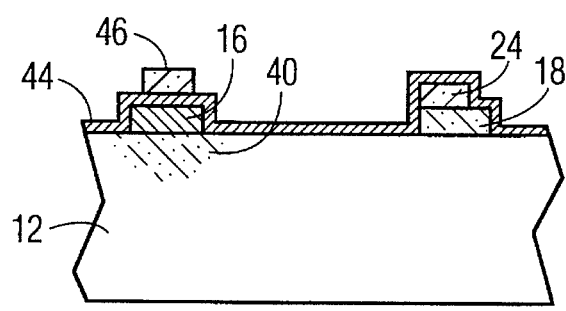

In FIG. 11, wafer 10 is shown after a dry oxide layer 44, which may, for example, comprise silicon dioxide having a thickness on the order of 1000 angstroms, has been grown over the entire wafer. As will soon be apparent, this oxide will later serve as a gate oxide. On top of oxide layer 44, polysilicon material is deposited, doped, defined, and etched to create a polysilicon gate region 46 above island 16 as will be readily appreciated by those of ordinary skill in this art.

Integrated circuit/wafer processing continues in accordance with the present invention in accordance with well known techniques. Particularly, source/drain regions are defined and implanted. Specifically, silicon dioxide layer 44 is removed from the surfaces of p-type island 16 except for that portion directly beneath polysilicon gate region 46.

Figure 12:
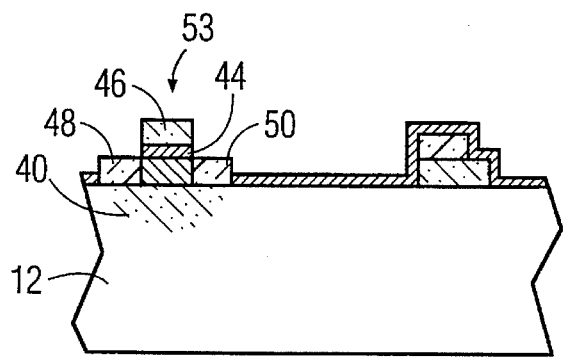

Also, the source/drain n<+>regions 48 and 50 are defined and ion implanted. The structure resulting from the sequence of process steps illustrated schematically in FIG. 12 thus includes source/drain terminals 48 and 50 adjacent p-type region 16 over which lies polysilicon gate 46 and insulated therefrom by silicon dioxide insulating layer 44 to thereby comprise a p-channel transistor structure 53. As is well known, the threshold voltage of p-channel region 16 will be determined by the specific design requirements of the devices being formed.

Figure 13:
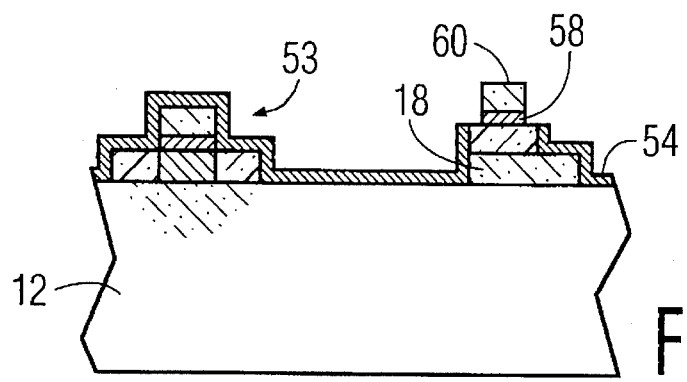

The same sequence of processing steps is repeated to define p<+>regions in n-type region 24. Thus, as shown in FIG. 13, another field oxide layer 54 is grown over the entire surface of the wafer. Field oxide layer 54 is opened above n-type region 24, a second gate oxide layer 58 is grown over the wafer, and polysilicon material is deposited, defined, and etched to create polysilicon gate region 60.

Figure 14:
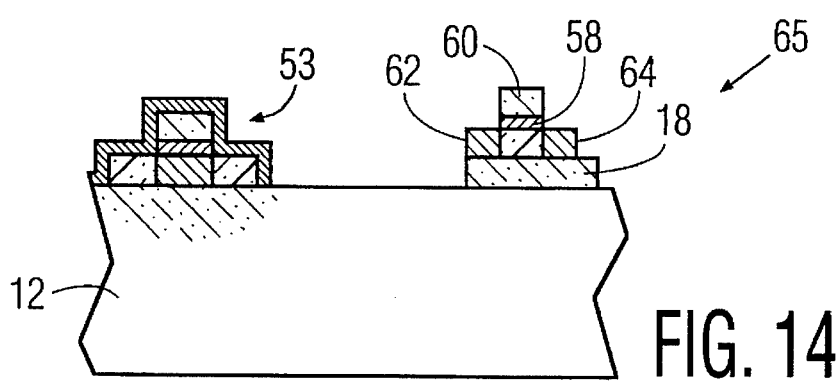

With reference now to FIG. 14, wafer 10 is shown after gate oxide layer 58 has been removed from all surfaces of n-type region 24 except that underlying polysilicon region 60 and after source/drain p<+>regions 62 and 64 have been defined and implanted to thereby form an n-channel transistor structure 65. The threshold voltage of n-channel region 24 will be determined by the specific design requirements of the devices being formed. It will be readily appreciated by those skilled in the art that polysilicon regions 52 and 60 have been used as masks or shields to thereby define the n<+>48, 50 and p<+>regions 62, 64, thus constituting well known self-aligned gate processing techniques. It should also be noted that masking of transistor structure 53 during etching of the gate oxide layer 58 is not necessary if the field oxide layer is much thicker than the gate oxide layer 58 and careful etching of the dry oxide comprising the gate oxide layer 58 is performed.

Figure 15:
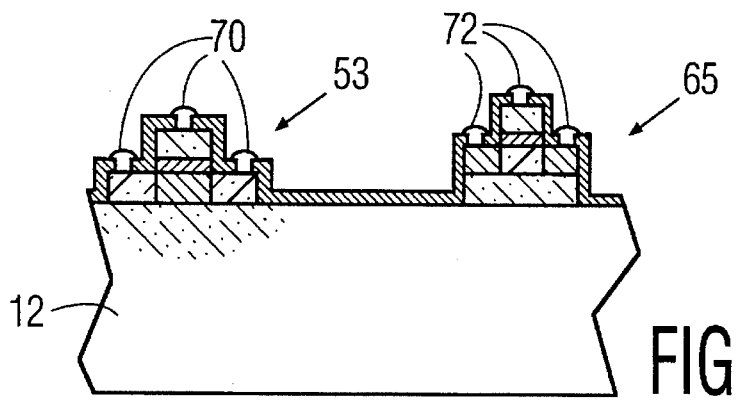

FIG. 15 illustrates how the structure as illustrated in FIG. 14 can be further processed to form contact and interconnect areas. As would be readily understood, the structure thus far developed can further be processed so as to from a silicon dioxide layer overlying the structure and devices created by the previous fabrication steps and, by well known techniques, by opening contact windows within the silicon dioxide layer and thereafter applying through conventional metallization techniques a metal layer to define gate contacts as 70 and 72 and so on.

Obviously, many other modifications and variations of the present invention are possible in light of the above teachings. For example, it is to be understood that the n-channel and p-channel implantation processing steps described above are specific to the formation of field effect transistors and that such steps are stated by way of example only. Notwithstanding the description and illustration of this specific example within the scope of the present invention, it will be readily ascertained that it is within the scope of the present invention that other device processing steps could also be used subsequently, prior to, and/or in addition to those described to form the same and/or other types of semiconductor devices. Such modifications and other which will become apparent to those skilled in the art upon consideration of this disclosure are considered to be within the scope and spirit of this invention as set forth in the appended claims.

What is claimed is:

1. A method of fabricating a silicon-on-insulated conductor structure for semiconductor integrated circuits, comprising the steps of:

providing a substrate of semiconductor material of a first conductivity type having a substantially smooth and trenchless first side and a second side;

depositing a first layer of semiconducting material of a second conductivity type directly on all of said first side of said substrate;

defining a plurality of islands in said first layer;

growing a second layer of said semiconducting material on at least one of said islands, said second layer being of said first conductivity type;

forming a porous region beneath said at least one island; and selectively oxidizing said porous region to form an isolating layer.

2. A method of fabricating a silicon-on-insulated conductor structure for semiconductor integrated circuits, comprising the steps of:

providing a substrate of semiconductor material of a first conductivity type having a substantially smooth and trenchless first side and a second side;

depositing a first layer of semiconducting material of a second conductivity type directly on all of said first side of said substrate;

defining a plurality of islands in said first layer;

growing a second layer of said semiconductor material on at least one of said islands, said second layer being of said first conductivity type;

forming a first porous region beneath said at least one island and a second porous region beneath another one of said islands;

selectively oxidizing said first and second porous regions; and defining a semiconductor device in each of said at least one of said islands and said second layer.

3. The method of claim 2, wherein said semiconductor material is single crystal silicon.

4. The method of claim 2, wherein said semiconductor device is selected from the group consisting of diodes, transistors, resistors, and capacitors.

5. The method of claim 2, wherein said semiconductor device has at least two terminals comprised of semiconductor material of said second conductivity, said terminals comprising the source and drain terminals of a transistor and wherein said semiconductor device further comprises a channel between said source and drain terminals, said channel being comprised of semiconductor material of said first conductivity.

6. The method according to claim 2, wherein said first conductivity type is n-type.

7. The method of claim 1, further comprising forming a semiconductor device in said second layer.

8. The method of claim 7, wherein said device forming step comprises implanting at least one heavily doped region having said second conductivity into said second layer.

9. The method of claim 1, further comprising a step of forming a second porous region in said substrate beneath another one of said islands and oxidizing said second region to form an isolating layer between said substrate and said another one of said islands.

10. The method of claim 9, further comprising the step of forming a semiconductor device in said another one of said islands.

11. The method of claim 10, wherein said step of forming a semiconductor device in said another one of said islands comprises implanting at least one heavily doped region having said second conductivity into said another one of said islands.

12. The method of claim 2, wherein said step of forming a porous region includes electrochemically anodizing said substrate.

* * * * *